United States Patent [19]
Huh

[11] Patent Number: 6,114,237
[45] Date of Patent: Sep. 5, 2000

[54] METHOD OF FORMING CONTACTS FOR A SEMICONDUCTOR DEVICE

[75] Inventor: No-Hyun Huh, Yongin-shi, Rep. of Korea

[73] Assignee: Samsung Electronics Co., Ltd., Suwon, Rep. of Korea

[21] Appl. No.: 09/140,331

[22] Filed: Aug. 26, 1998

[30] Foreign Application Priority Data

Aug. 28, 1997 [KR] Rep. of Korea .................. 97-42212

[51] Int. Cl.$^7$ .............................................. H01L 21/469
[52] U.S. Cl. ................................... 438/640; 438/701
[58] Field of Search ............................ 438/640, 701, 438/673, 637, 638

[56] References Cited

U.S. PATENT DOCUMENTS 5,461,004 10/1995 Kim .

Primary Examiner—Caridad Everhart
Attorney, Agent, or Firm—Jones Volentine, LLP

[57] ABSTRACT

A method of forming contacts of a semiconductor device while improving a step coverage and increasing margins between the device and an adjacent device. The novel method comprises the steps of forming an interlayer insulating film. A contact hole is formed in the interlayer insulating film. A mask layer is deposited over the contact hole to a thickness sufficient to withstand the planarization process and is planarization-etched. Wet-etching is performed over the entire semiconductor substrate, thereby etching the interlayer insulating film, wherein the wet-etching is characterized in that exposed portions of the interlayer insulating film outside of the contact hole and interfacing the mask layer are etched faster than other upper exposed portions of the interlayer insulating film. As a result, the contact hole has a sloped-sidewalls profile. With this sloped profile of the contact sidewalls, the step coverage of the metal line can be improved and the horizontal margins for isolating devices is increased, thus improving the degree of integration.

6 Claims, 4 Drawing Sheets

METHOD OF FORMING CONTACTS FOR A SEMICONDUCTOR DEVICE

BACKGROUND OF THE INVENTION

1. Field of the Invention

The present invention relates to a method of forming contacts for a semiconductor device, and more particularly, to a contact hole having an improved profile that allows better metal step coverage.

2. Description of the Related Art

FIG. 1a to FIG. 1c are flow diagrams showing a prior art method of forming contacts for a semiconductor device.

Referring to FIG. 1a, an interlayer insulating film 14 is formed on a semiconductor substrate 10. The interlayer insulating film 14 can be formed on a lower metal line (not shown) which is formed on the semiconductor substrate 10. A photoresist layer is formed on the interlayer insulating film 14 and etched to form a predetermined configuration (i.e., photoresist layer pattern 18) to define a contact region.

Portions of the exposed interlayer insulating film 14 are etched using the photoresist layer pattern 18 as a mask. Etching the interlayer insulating film 14 is performed by wet-etching. Since the wet-etching process is usually isotropic, meaning that etching proceeds outward in all directions, the upper recess portion includes undercut portions 19 of the interlayer insulating film 14 beneath the photoresist layer pattern 18. As a result, the upper layer of the portions of the interlayer insulating film 14 exposed by the photoresist layer pattern 18 has a sloped profile.

Referring to FIG. 1b, subsequent to the above isotropic wet-etching process, an anisotropic dry-etching process is conducted on the interlayer insulating film 14 through the opening of the photoresist layer pattern 18 so as to further remove unwanted parts of the interlayer insulating film 14, thereby entirely exposing the upper surface of the semiconductor substrate 10 or the lower metal line (not shown). Since the dry-etching process is highly anisotropic, meaning that the etching proceeds in only one direction (here, the downward direction), the sidewall of the bottom recess formed by dry-etching has a substantially vertical profile, as shown in FIG. 1b.

The photoresist layer pattern 18 is then removed. The upper recess portion and the bottom recess portion in combination constitute the desired metal contact hole 20, as shown in FIG. 1c.

The upper sidewalls of the contact hole 20 have a sloped profile. This is to improve the step coverage of the deposited metal.

FIG. 2 is a cross-sectional view showing a contact hole which is formed by a conventional method described above.

Referring to FIG. 2, the contact hole 20 which is formed by sequentially performing the wet-etching and dry-etching (hereinafter "wet-dry-etching") has a relatively close distance 16a between the wet-etched-surface 15a of the interlayer insulating film 14 and gate electrode layers 12, thereby reducing margins of interlayer insulating film 14 for isolating devices. That leads to a limited degree of integration.

To enlarge the margins for isolating devices, a method which employs sequentially performing dry-etching, wet-etching, and dry-etching (hereinafter "dry-wet-dry-etching") has been widely used in the art.

A contact hole which is formed by the dry-wet-dry-etching method has an etched-surface as illustrated in FIG. 2 as dotted lines, identified with reference number 15b.

The distance 16b between the gate electrode layers 12 and the etched-surface produced by the dry-wet-dry-etching method is relatively great compared with the distance 16a produced by the wet-dry-etching method.

However, considering the recent trend toward high density of integration, the drywet-dry-etching method also presents a limit.

SUMMARY OF THE INVENTION

The present invention is intended to address these problems, and it is an object of the invention to provide a method of forming contacts having a sloped sidewalls profile which results in improved metal step coverage.

It is a further object to provide a method of forming contacts which increases the margins of interlayer insulating film for isolating devices.

To achieve these and other advantages in a preferred embodiment in accordance with the present invention, a method of forming contacts comprises the steps of: forming an interlayer insulating film on a top surface of a semiconductor substrate; forming a mask layer pattern on the interlayer insulating film; forming a contact hole by dry-etching portions of the interlayer insulating film exposed by the mask layer pattern; removing the mask layer pattern; forming a mask layer to overfill the contact hole; etching back the mask layer to expose an upper surface of the interlayer insulating film outside of the contact hole; wet-etching the entire top surface of the semiconductor substrate, thus etching the interlayer insulating film outside of the contact hole, wherein the contact hole has sloped-sidewalls formed by the wet-etching; and removing the mask layer.

In another aspect of the present invention, a method comprises the steps of: forming an interlayer insulating film on a lower metal line which is formed on a top surface of a semiconductor substrate; forming a contact hole by etching the interlayer insulating film to expose portions of the lower metal line, the contact hole having a vertical sidewalls profile; overfilling the contact hole with a photoresist layer with low viscosity; etching back the photoresist layer to expose an upper surface of the interlayer insulating film outside of the contact hole; wet-etching the entire top surface of the semiconductor substrate, thus etching the interlayer insulating film outside of the contact hole, wherein the contact hole has sloped-sidewalls formed by the wet-etching; and removing the photoresist layer.

In another aspect of the present invention, the sidewalls of the contact hole have a sloped profile, thereby having a good metal step coverage.

BRIEF DESCRIPTION OF THE DRAWINGS

The present invention may be understood and its objects will become apparent to those killed in the art by reference to the accompanying drawings as follows.

DESCRIPTION OF THE PREFERRED EMBODIMENTS

A preferred embodiment of the present invention will now be described with reference to the accompanying drawings FIG. 3a to FIG. 3e.

FIG. 3a to FIG. 3e are flow diagrams showing a novel method of forming contacts of a semiconductor device which is formed by embodiments of the present invention.

Figure 1A:
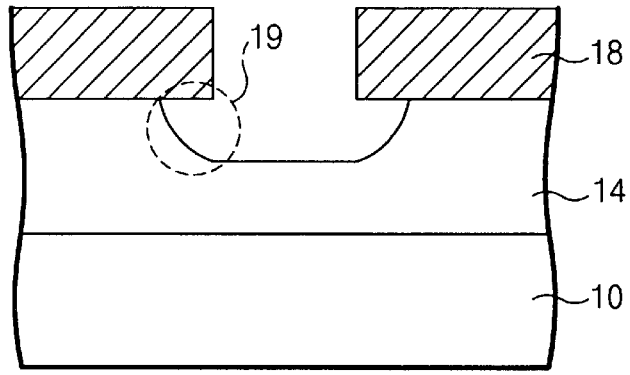
FIG. 1a to FIG. 1c are flow diagrams showing a prior art method of forming contacts of a semiconductor device.
Figure 1B:
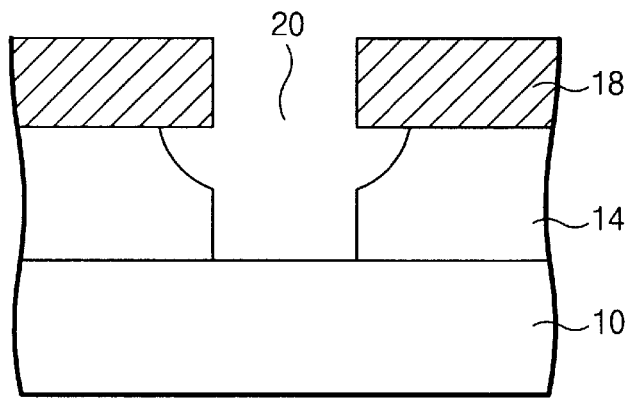
Figure 1C:
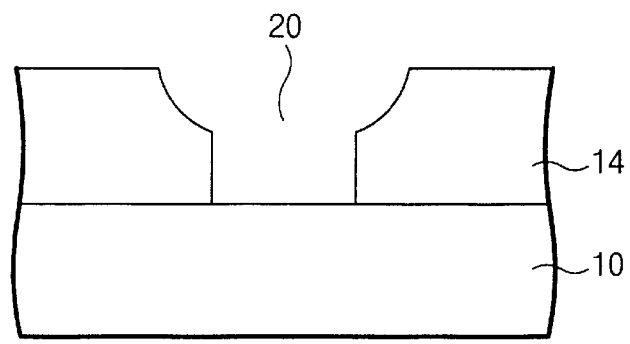
Figure 2:
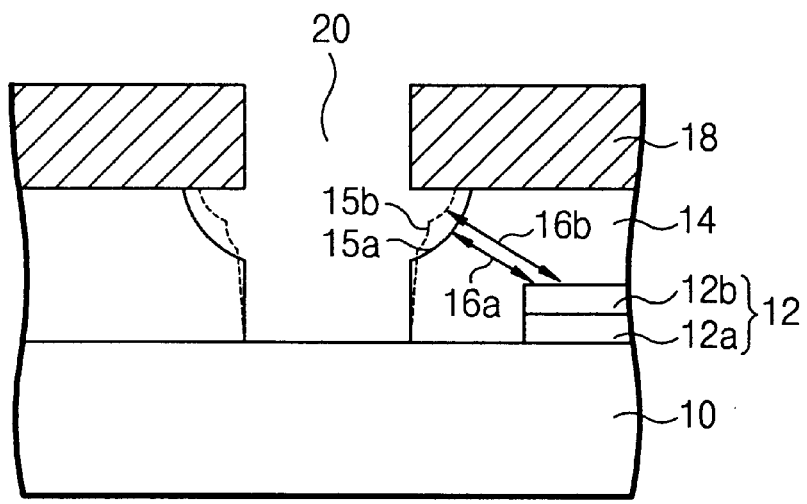
FIG. 2 is a cross-sectional view showing the etched-surface of the interlayer insulating film which is formed by conventional art.
Figure 3A:
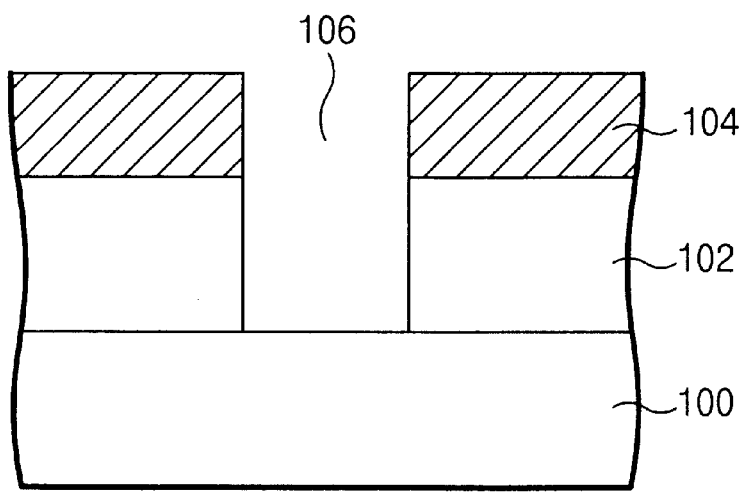
FIG. 3a to FIG. 3e are flow diagrams showing a novel method of forming contacts of a semiconductor device which is formed by embodiments of the present invention.

Referring to FIG. 3a, an interlayer insulating film 102 is formed on a semiconductor substrate 100. The interlayer insulating film 102 can be formed on a lower metal line (not shown) which is formed on the semiconductor substrate 100. A photoresist layer, or the like is formed on the interlayer insulating film 102 and etched to form a predetermined configuration (i.e., a mask layer pattern 104) to define a contact region. Portions of interlayer insulating film 102 exposed by the mask layer pattern 104 are removed to form a contact hole 106.

The removal of the interlayer insulating film 102 is performed by an anisotropic dry-etching process which is conducted on the interlayer insulating film 102 through the opening of the mask layer pattern 104 to entirely expose the upper surface of the semiconductor substrate 100 or the lower metal line (not shown). Since the dry-etching process is highly anisotropic, meaning that the etching proceeds in only one direction (here, the downward direction), the sidewall of the contact hole 106 has a substantially upright profile (vertical profile), as shown in FIG. 3a.

Figure 3B:
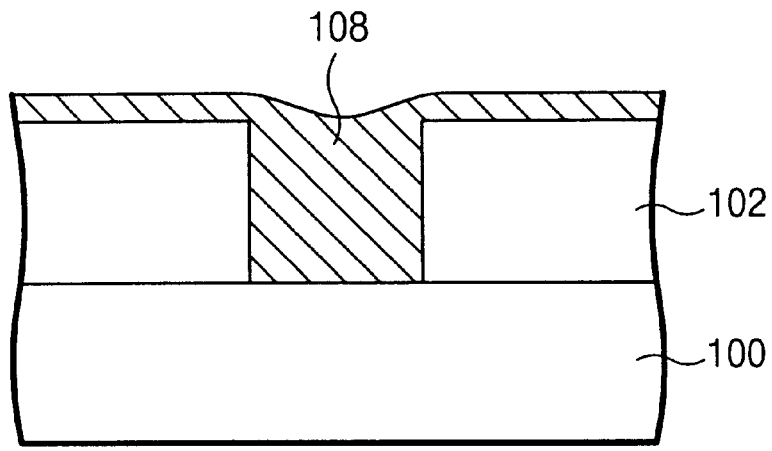

The mask layer pattern 104 is removed and a mask layer 108 is deposited to overfill the contact hole 106, as shown in FIG. 3b. The mask layer pattern 104 is removed by ashing, $H_2SO_4$ stripping, or organic stripping. The mask layer 108 is for example a photoresist layer having a low viscosity of about 10 cp (Centi-Poise) or less. The low viscosity photoresist layer is provided to minimize the time to subsequently etch back the mask layer 108.

Figure 3C:
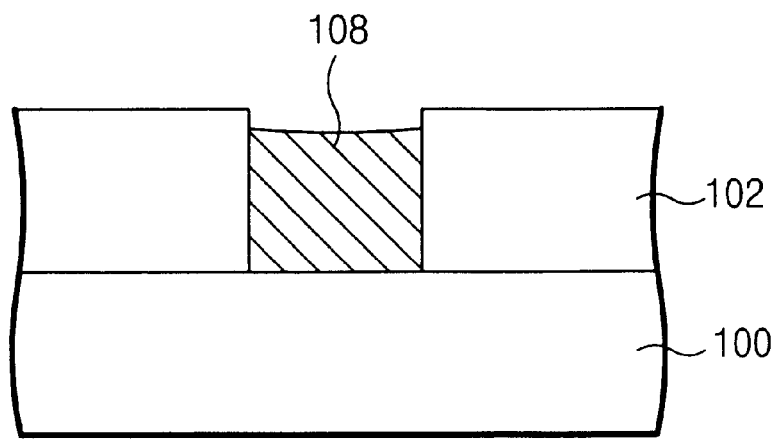

The mask layer 108 is etched back until an upper surface of the interlayer insulating film 102 outside of the contact hole 106 is exposed, as shown in FIG. 3c.

Figure 3D:
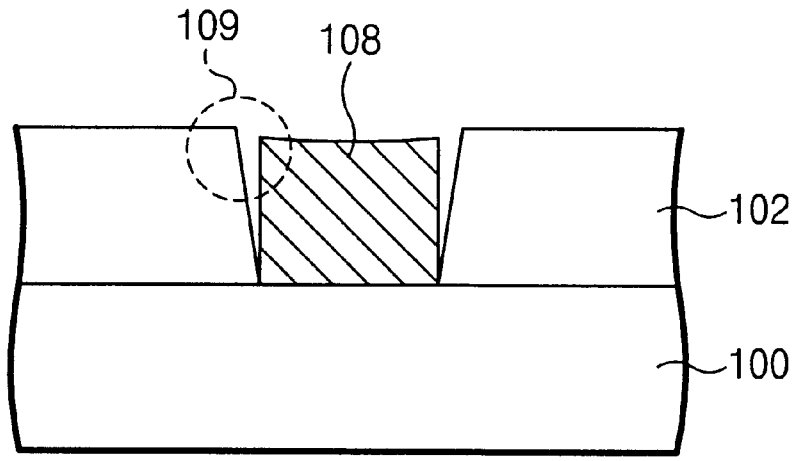

Referring to FIG. 3d, a wet-etching process is performed on the entire semiconductor substrate 100, thereby etching the interlayer insulating film 102 outside of the contact hole 106. At this time, portions of an exposed interlayer insulating film 102 outside of the contact hole 106 interfacing the mask layer 108 are etched faster than other upper portions of the exposed interlayer insulating film 102, thereby producing a contact hole 106 having a sloped sidewalls profile 109.

With the conventional method, the wet-etching proceeds laterally to the interlayer insulating film beneath the mask layer pattern etching the interlayer insulating film in a lateral direction. On the other hand, with the present invention method, the wet-etching proceeds downward, etching the interlayer insulating film in a vertical direction, thereby increasing margins of the interlayer insulating film for isolating devices.

Figure 3E:
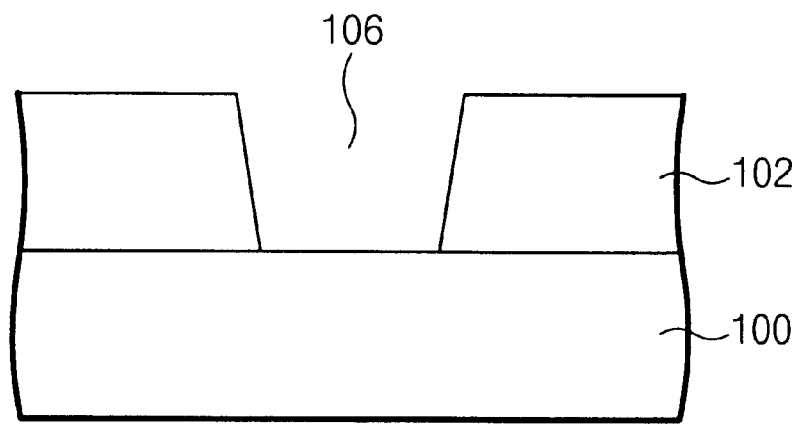

The mask layer 108 is then removed to form the contact hole 106 having both sidewalls with a sloped profile, as shown in FIG. 3e.

The metal line is filled with a metal layer to form a multi-level metal line in subsequent process. At this time, the contact hole has a sloped sidewalls profile, thus forming the multi-level metal line with good step coverage.

While this invention has been particularly shown and described with reference to the preferred embodiments thereof, it will be understood by those skilled in the art that various changes in form and details may be made without departing from the spirit and scope of this invention.

What is claimed is:

1. A method of forming contacts for a semiconductor device, comprising:

forming an interlayer insulating film on a top surface of a semiconductor substrate;

forming a mask layer pattern on said interlayer insulating film;

forming a contact hole by dry-etching portions of said interlayer insulating film which are exposed by said mask layer pattern;

removing said mask layer pattern;

forming a mask layer to overfill said contact hole;

etching back said mask layer to expose an upper surface of said interlayer insulating film outside of said contact hole;

wet-etching the entire top surface of said semiconductor substrate, thus etching said interlayer insulating film outside of said contact hole, wherein said contact hole has sloped-sidewalls formed by said wet-etching; and removing said mask layer.

2. The method according to claim 1, wherein said mask layer has a viscosity of about 10 cp or less.

3. The method according to claim 1, wherein said wet-etching is characterized in that exposed portions of said interlayer insulating film outside of said contact hole interfacing with said mask layer are etched faster than other upper portions of said interlayer insulating film.

4. A method of forming contacts of a semiconductor device having multi-level metal layers comprising:

forming an interlayer insulating film on a lower metal line which is formed on a top surface of a semiconductor substrate;

forming a contact hole by etching said interlayer insulating film to expose portions of said lower metal line, said contact hole having a vertical sidewalls profile;

overfilling said contact hole with a photoresist layer with a low viscosity;

etching back said photoresist layer to expose an upper surface of said interlayer insulating film outside of said contact hole;

wet-etching the entire top surface of said semiconductor substrate, thus etching said interlayer insulating film outside of said contact hole, wherein said contact hole has sloped-sidewalls formed by said wet-etching; and removing said photoresist layer.

5. The method according to claim 4, wherein said photoresist layer has a viscosity of about 10 cp or less.

6. The method according to claim 4, wherein said wet-etching is characterized in that exposed portions of said interlayer insulating film outside of said contact hole interfacing with said photoresist layer are etched faster than other upper portions of said interlayer insulating film.

* * * * *